United States Patent [19]

Barnes et al.

[11] Patent Number: 5,480,840
[45] Date of Patent: Jan. 2, 1996

[54] MULTI-CHIP MODULE WITH MULTIPLE COMPARTMENTS

[75] Inventors: Lawrence C. Barnes; Gary R. Thornberg, both of Colorado Springs, Colo.

[73] Assignees: AT&T Global Information Solutions Company, Dayton, Ohio; Hyundai Electronics America, Milpitas, Calif.; Symbios Logic Inc., Fort Collins, Colo.

[21] Appl. No.: 292,448

[22] Filed: Aug. 18, 1994

Related U.S. Application Data

[62] Division of Ser. No. 913,100, Jul. 14, 1992, Pat. No. 5,369,552.

[51] Int. Cl.[6] ..................................... H01L 21/60
[52] U.S. Cl. .................. 437/209; 437/214; 437/215; 437/221
[58] Field of Search .................... 437/209, 211, 437/214, 215, 217, 219, 220, 221; 257/685, 704, 712, 723, 724, 725; 361/753, 796, 800, 816

[56] References Cited

U.S. PATENT DOCUMENTS

| | | | |
|---|---|---|---|
| 4,370,515 | 1/1983 | Donaldson | 174/35 R |
| 4,569,000 | 2/1986 | Noji | 361/394 |
| 4,658,334 | 4/1987 | McSparran et al. | 361/415 |
| 4,717,990 | 1/1988 | Tugcu | 361/424 |
| 4,739,453 | 4/1988 | Kurokawa | 361/424 |
| 4,974,317 | 12/1990 | Rodriguez, II et al. | 257/712 |
| 5,243,218 | 9/1993 | Zenitani et al. | 257/712 |
| 5,303,121 | 4/1994 | Thornberg | 361/760 |

*Primary Examiner*—Brian E. Hearn
*Assistant Examiner*—Kevin M. Picardat
*Attorney, Agent, or Firm*—Wayne P. Bailey; James Stover

[57] ABSTRACT

The present invention provides a multi-chip module having multiple compartments. Circuitry is arranged on a substrate in such a manner that circuit components requiring specific operating environments are located in discrete areas dedicated to accommodate the circuit components. A cover, having multiple chambers that align with the discrete areas on the substrate, is secured to the substrate to define the multiple compartments. The compartments are separated by material that effectively isolates the compartments relative to one another.

3 Claims, 2 Drawing Sheets

MULTI-CHIP MODULE WITH MULTIPLE COMPARTMENTS

This is a division of application Ser. No. 07/913,100, filed on Jul. 14, 1992 now U.S. Pat. No. 5,369,552.

FIELD OF THE INVENTION

The present invention relates to the arrangement of integrated circuit components on a Multi-Chip Module.

BACKGROUND OF THE INVENTION

Those skilled in the art of integrated circuits will recognize the benefits of maximizing the number of components on a single Multi-Chip Module (MCM). For example, the components on a Multi-Chip Module typically require less space and operate more quickly than their conventional counterparts. However, those skilled in the art will also recognize that some components require operating environments that are incompatible with the operating requirements of other components. For example, an oscillator should be maintained at constant elevated temperature to maintain accuracy, while circuitry with high power consumption should be cooled. Similarly, some components may require isolation from noise, electricity, electromagnetic interference (EMI), electrostatic interference and/or radiation, which may emanate from other components. Accordingly, a need exists for effectively isolating various components on a Multi-Chip Module.

SUMMARY OF THE INVENTION

According to one embodiment, the present invention provides a multi-chip module having multiple compartments. Circuitry is arranged on a substrate in such a manner that circuit components requiring specific operating environments are located in discrete areas dedicated to accommodate the circuit components. A cover, having multiple chambers that align with the discrete areas on the substrate, is secured to the substrate to define the multiple compartments. The compartments are separated by material that effectively insolates the compartments relative to one another.

According to another embodiment, the present invention provides a cover for a substrate bearing multiple integrated circuit components as well as discrete circuit components such as resistors, capacitors, inductors, transistors and diodes. The cover includes a peripheral wall, a top, and an interior wall. The top abuts the peripheral wall to define a containment space. The interior wall extends between discrete portions of the peripheral wall to divide the containment space into multiple chambers. The chambers align with the components on the substrate to effectively isolate a first component relative to a second component. Ideally, the interior wall effectively isolates against the transfer of heat, electricity, noise, electromagnetic interference, electrostatic interference and radiation, and it is integrally joined to the peripheral wall and the top. The top should similarly isolate the enclosed components from each other as well as external interferences, the portion of the top over each compartment having the same isolating characteristics as the walls for the compartment.

According to another embodiment, the present invention provides a multi-chip module having a housing that includes a first compartment and a second compartment. The first compartment is effectively environmentally isolated relative to the second compartment. A first component or group of components having a first set of operating parameters is positioned within the first compartment. A second component or group of components having a second set of operating parameters, which is incompatible with the first set of operating parameters, is positioned within the second compartment. The housing includes a substrate, which supports the first component and the second component, and a cover having a first chamber and a second chamber. The substrate is connected to the cover to effectively seal the first chamber relative to the second chamber, thereby defining the first compartment and the second compartment therebetween.

According to another embodiment, the present invention provides a multi-chip module having an effectively isolating partition between otherwise disruptive components. Additionally, the present invention provides a multi-chip module having circuitry arranged in such a manner that circuit components requiring specific operating environments are located in discrete areas dedicated to accommodate the components. Similarly, the present invention provides a method of making a multi-chip module that includes the step of arranging the components within the module in such a manner that circuit components requiring specific operating environments are located in discrete areas dedicated to accommodate the components.

The advantages of the present invention will become apparent to those skilled in the art upon a more detailed description of a preferred embodiment.

BRIEF DESCRIPTION OF THE DRAWINGS

Referring to the Figures, wherein like numerals represent like parts throughout the several views.

DETAILED DESCRIPTION OF A PREFERRED EMBODIMENT

Figure 1:
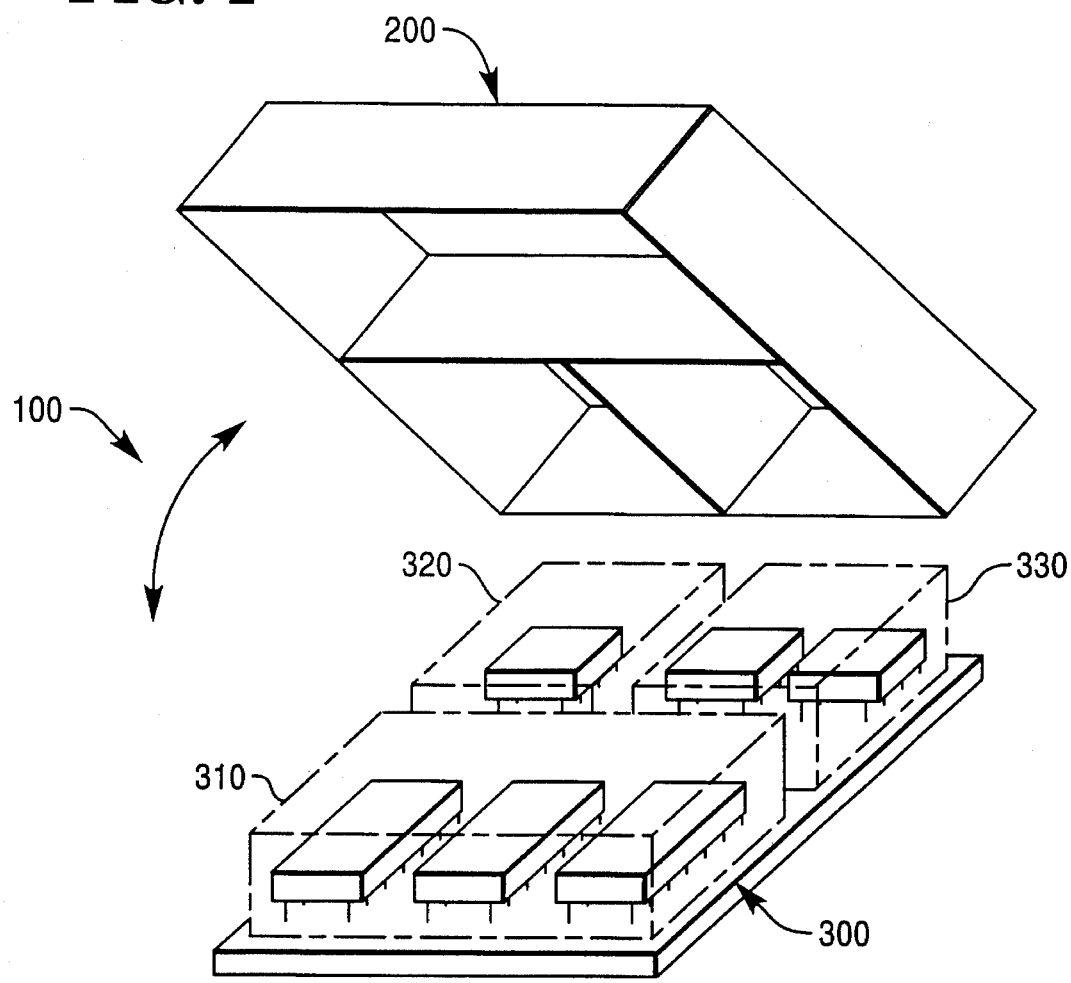
FIG. 1 is a perspective view of a multi-chip module constructed according to the principles of the present invention, showing its cover removed from its substrate.
Figure 4:
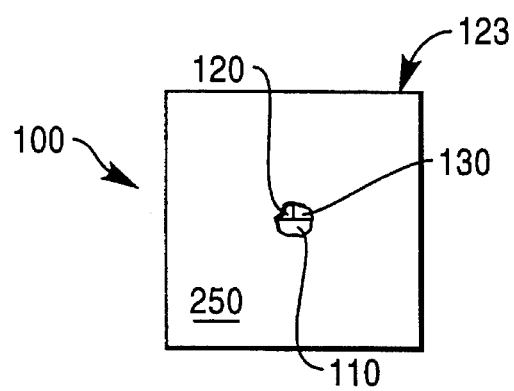
FIG. 4 is a top view of the multi-chip module shown in FIG. 1 with a portion of the cover broken away.
Figure 5:
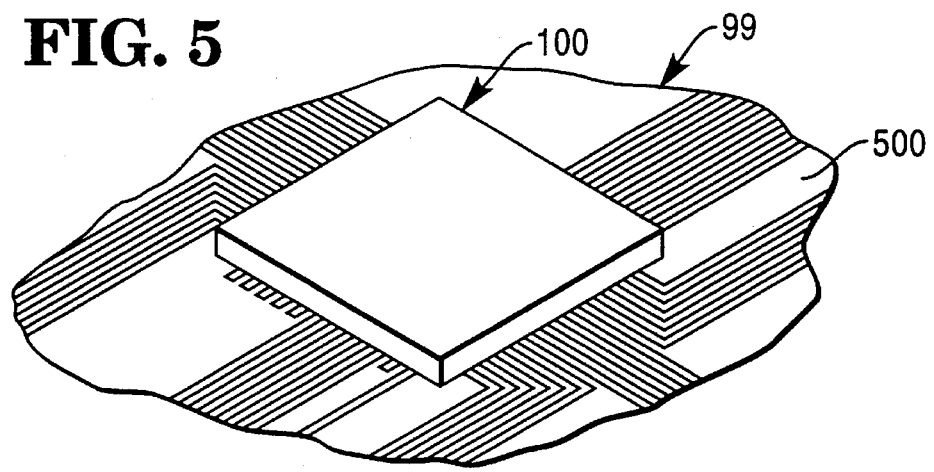
FIG. 5 is a perspective view of a portion of a printed circuit board on which is mounted the multi-chip module shown in FIG. 1.

For purposes of describing the present invention, a multi-chip module is defined as any advanced semiconductor substrate which provides an interconnect path between electrical components. In FIG. 1, a preferred embodiment of a multi-chip module (MCM) constructed according to the principles of the present invention is designated at 100. The MCM 100 includes a cover 200 and a substrate 300, which interconnect to define a housing 123 (as shown in FIG. 4). Circuit component areas 310, 320, and 330, each including one or more integrated circuits or other discrete circuit components, are designated on the substrate 300 and reside within the housing 123. Once assembled, the MCM 100 is suitable for mounting to a printed circuit board 99 (as shown in FIG. 5) for inclusion in a computer or other electronic system. Mounting to the printed circuit board can be realized with pin grid socket, surface mount, or through-hole techniques, depending upon the multichip module design.

Figure 2A:
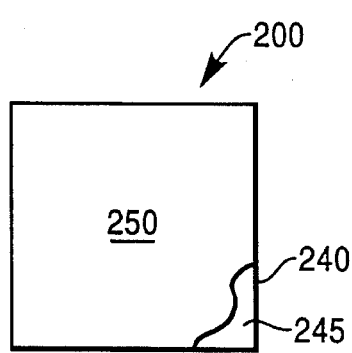
FIG. 2a is a top view of the cover shown in FIG. 1.
Figure 2B:
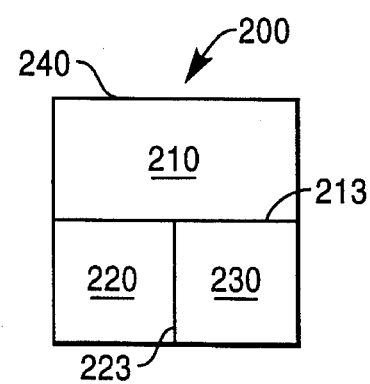
FIG. 2b is a bottom view of the cover shown in FIG. 1.

As shown in FIG. 2a, the cover 200 includes a top 250 that abuts a peripheral wall 240 to define a containment space 245. As shown in FIG. 2b, an interior wall or partition 213 extends between discrete portions of the peripheral wall 240 to divide the containment space 245 into multiple chambers or cavities. The first chamber is designated as 210, and the second chamber is subdivided by a second interior wall 223 into chambers 220 and 230. In a preferred embodiment, the peripheral wall 240, the top 250, and the interior walls 213 and 223 are integrally joined to one another to comprise the cover 200. Peripheral wall 240 and top 250 provide an insulating/isothermal barrier between chambers 210, 220 and 230 and the external environment., while interier walls 213 and 223 provide insulating/isothermal barriers between adjacent chambers.

Figure 3:
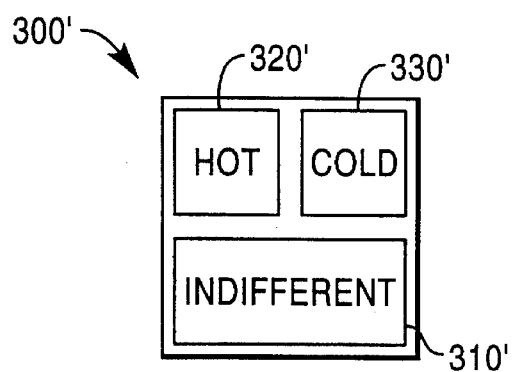
FIG. 3 is a top view of a substrate similar to that shown in FIG. 1.

Those skilled in the art will recognize that the arrangement of circuitry on a multi-chip module will vary according to each application. With the foregoing in mind, the present invention will be described with reference to FIG. 3, which shows a substrate 300' supporting a first component block 310', a second component block 320', and a third component block 330'. The first component block 310' includes at least one circuit component and does not require a special (or dedicated) operating environment. The second component block 320' includes at least one circuit component and requires above normal (HOT) temperatures for reliable operation of the component(s). The third component block 330' includes at least one circuit component and requires below normal (COLD) temperatures for reliable operation of the component(s). Accordingly, the component blocks are arranged on the substrate 300' in such a manner that the HOT and COLD components 320' and 330', respectively, are isolated from the other components 310', as well as from one another.

The components described above are attached to the substrate by flip-chip or flip-tab methodologies, thereby allowing the backside of the components to be in contact with the module cover via a thermal grease. Heating or cooling is applied to a given area through this backside contact and through the use of known methods of heating and cooling such as Peltier cooling or water cooling/heating.

Heating can be accomplished through the inclusion of a power dissipating device such as a resistor within the compartment to be heated. The voltage or current to this device would be regulated by a thermostatic control circuit, a thermistor or bi-metallic device functioning as a temperature sensing element. An alternative method for heating a chamber would be to use the power being dissipated by the circuitry enclosed within the compartment and using a cooling device to limit the upper temperature excursion.

Cooling of a compartment can be affectuated through the use of a Peltier device. This device cools the component to which it is attached when a current is passed through the device. Several components can be cooled by thermally connecting the components to a thermal pad on the substrate to which the Peltier device is also attached.

Alternatively, one or more of the component blocks could be dedicated to integrated circuit components having potentially disruptive operating characteristics. For example, certain components may not require a HOT environment, but they may radiate sufficient heat to disrupt the operation of other components, and thus, they may similarly require isolation. Additionally, certain components may require isolation against the transfer of electricity, noise, and/or radiation, as well.

In any event, components 310, 320, and 330 are arranged on the substrate 300 in such a manner that circuit components requiring specific operating environments are located in discrete areas dedicated to accommodate the components. The chambers 210, 220, and 230 of the cover 200 align with the components 310, 320, and 330, respectively, on the substrate 300. The cover 200 is secured to the substrate 300 to effectively seal the chambers 210, 220, and 230 relative to one another and define multiple compartments therebetween. As shown in FIG. 4, a first compartment 110 effectively environmentally isolates the first component 310; a second compartment 120 effectively environmentally isolates the second component 320; and a third compartment 130 effectively environmentally isolates the third component 330.

The composition of the walls (interior and peripheral) is simply a function of the requirements of the components on a given MCM. In other words, the walls are selectively made of materials known to effectively isolate against the transfer of heat, electricity, noise, radiation, etc . . . The term "effectively isolate" implies that the wall material provides isolation sufficient to maintain the necessary operating conditions for the component(s) in question. Accordingly, the MCM 100 may be said to have an effectively isolating partition between otherwise disruptive components.

It can thus be seen from the above description, the the present invention provides a methodology whereby several circuit components having differing heating, cooling or isolation requirements may be mounted on the same module. For example, a highly accurate crystal oscillator requiring maintenance at an elevated temperature may be mounted unto a single module including a microprocessor requiring cooling and having RF and IF sections requiring electromagnetic isolation. The benefits to be gained from the present invention include increased miniaturization of computer and electronic devices as fewer modules will be required to implement a design. Increased reliability, decreased costs and decreased manufacturing time will also result from Those skilled in the art will recognize that the preceding description of a preferred embodiment was merely for purposes of illustration and explanation. Those skilled in the art will also recognize a variety of applications and modifications to the present invention that fall within the scope of the present invention. For example, the number of compartments, the arrangement of compartments, and the number of components in a given compartment will vary according to specific applications. Also, all of the components having a specific set of operating parameters need not be located in a single compartment. Accordingly, the present invention is to be limited only by the appended claims.

What is claimed is:

1. A method of making a multi-chip module, including the step of arranging the components within the module in such a manner that circuit components requiring specific thermal environments are located in discrete areas dedicated to accommodate the components.

2. A method for heating specific components on a multi-chip module, the steps comprising:

arranging the components within the module in such a manner that said specific components requiring heating are located in a discrete area within said module;

enclosing said specific components within a cover, thereby forming a chamber including said specific components and thermally isolating said specific components from the other components within said multichip module; and heating said chamber.

3. A method for cooling specific components on a multichip module, the steps comprising:

arranging the components within the module in such a manner that said specific components requiring cooling are located in a discrete area within said module;

enclosing said specific components within a cover, thereby forming a chamber including said specific components and thermally isolating said specific components from the other components within said multichip module; and cooling said chamber.

* * * * *